(12) United States Patent
Söhnle

(10) Patent No.: US 11,509,196 B2
(45) Date of Patent: Nov. 22, 2022

(54) MOTOR VEHICLE AND POWER CONVERTER DEVICE FOR A MOTOR VEHICLE

(71) Applicant: AUDI AG, Ingolstadt (DE)

(72) Inventor: Benjamin Söhnle, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 518 days.

(21) Appl. No.: 16/614,470

(22) PCT Filed: Mar. 22, 2018

(86) PCT No.: PCT/EP2018/057257
§ 371 (c)(1),
(2) Date: Nov. 18, 2019

(87) PCT Pub. No.: WO2018/215117
PCT Pub. Date: Nov. 29, 2018

(65) Prior Publication Data
US 2020/0169147 A1    May 28, 2020

(30) Foreign Application Priority Data
May 22, 2017  (DE) ............... 10 2017 208 632.7

(51) Int. Cl.
*H02K 9/19* (2006.01)
*H02K 11/33* (2016.01)
(Continued)

(52) U.S. Cl.
CPC ............ *H02K 9/19* (2013.01); *B60K 1/00* (2013.01); *B60K 11/02* (2013.01); *B60L 50/00* (2019.02); *H02K 11/33* (2016.01); *H02M 1/44* (2013.01); *H02M 7/003* (2013.01); *H05K 7/20927* (2013.01); *B60K 2001/006* (2013.01); *B60L 2210/40* (2013.01)

(58) Field of Classification Search
CPC . H02K 9/19; H02K 11/33; B60K 1/00; B60K 11/02; H02M 1/44; H02M 7/003; H05L 7/20927
USPC .......................................................... 310/54
See application file for complete search history.

(56) References Cited

U.S. PATENT DOCUMENTS

2001/0017039 A1   8/2001  Weimer et al.
2005/0006963 A1   1/2005  Takenaka et al.
(Continued)

FOREIGN PATENT DOCUMENTS

CN   106411025 A     2/2017
DE   43 11 518 A1   10/1994
(Continued)

OTHER PUBLICATIONS

Chinese Office Action dated Dec. 2, 2020, in connection with corresponding CN Application No. 201880033596.1 (12 pp., including machine-generated English translation).

(Continued)

*Primary Examiner* — Terrance L Kenerly
(74) *Attorney, Agent, or Firm* — Maier & Maier, PLLC

(57) ABSTRACT

Motor vehicle comprising an electric motor for driving the motor vehicle and a power converter device for supplying an alternating current to the electric motor, the power converter device having a cooling device, and the cooling device comprising at least one coolant connection, which is fluidically connected to a coolant port of the electric motor to form a common cooling circuit.

9 Claims, 4 Drawing Sheets

(51) Int. Cl.

| | |
|---|---|
| *B60L 50/00* | (2019.01) |
| *B60K 1/00* | (2006.01) |
| *B60K 11/02* | (2006.01) |
| *H02M 1/44* | (2007.01) |
| *H02M 7/00* | (2006.01) |
| *H05K 7/20* | (2006.01) |

(56) References Cited

U.S. PATENT DOCUMENTS

| | | |
|---|---|---|
| 2010/0097765 A1 | 4/2010 | Suzuki et al. |
| 2016/0039277 A1 | 2/2016 | Quintana et al. |
| 2016/0248302 A1 | 8/2016 | Nagao et al. |

FOREIGN PATENT DOCUMENTS

| | | |
|---|---|---|
| DE | 44 42 867 A1 | 6/1996 |
| DE | 10 2009 058 270 A1 | 6/2011 |
| DE | 10 2010 029 374 A1 | 12/2011 |
| DE | 10 2011 053 727 A1 | 3/2013 |
| DE | 10 2012 218 444 A1 | 4/2014 |
| DE | 10 2014 002 522 A1 | 8/2015 |
| DE | 10 2014 220 835 A1 | 4/2016 |
| DE | 10 2015 214 053 A1 | 1/2017 |
| DE | 10 2015 214 770 A1 | 2/2017 |
| JP | 2016032330 A | 3/2016 |
| JP | 2016174501 A | 9/2016 |
| WO | 2013/140704 A1 | 9/2013 |

OTHER PUBLICATIONS

European Examination Report dated Jan. 27, 2021, in connection with corresponding EP Application No. 18714999.2 (11 pp., including machine-generated English translation).

Chinese Office Action dated Jun. 11, 2021, in connection with corresponding CN Application No. 201880033596.1 (9 pp., including machine-generated English translation).

International Preliminary Report on Patentability (Chapter II) dated Nov. 28, 2019, in corresponding International application No. PCT/EP2018/057257; 7 pages.

Examination Report dated Apr. 6, 2018 in corresponding German application No. 10 2017 208 632.7; 10 pages.

International Search Report and Written Opinion of the International Searching Authority dated Jul. 5, 2018 in corresponding International application No. PCT/EP2018/057257; 30 pages.

International Preliminary Report on Patentability dated Aug. 28, 2019 in corresponding International application No. PCT/EP2018/057257; 38 pages.

MOTOR VEHICLE AND POWER CONVERTER DEVICE FOR A MOTOR VEHICLE

FIELD

The disclosure relates to a motor vehicle including an electric motor for driving the motor vehicle and a power converter device for supplying an alternating current to the electric motor, said power converter device having a cooling device.

BACKGROUND

In a motor vehicle that is driven either partially or fully by electrical means, a DC voltage supplied by a high-voltage battery is typically converted by means of a power converter device into a single-phase or multi-phase alternating current for driving an electric motor. The particular focus here will be on the cooling, by means of a cooling device, of the power converter device, which becomes heated during operation.

DE 10 2009 058 270 A1 discloses an inverter for electric traction control systems in the field of automotive technology, comprising power modules arranged on a cooling plate and connected to an electronic machine, and a water cooler located beneath the power modules.

In such an assembly, the water cooler is provided exclusively for cooling the power converter device and takes up a considerable amount of space. Furthermore, leakage-prone seals are located inside the inverter.

DE 10 2010 029 374 A1 further discloses a power electronics assembly having a power electronics housing and electronic components accommodated therein, along with a connector device having electric terminals arranged on the power electronics housing, which are provided for connecting a plurality of high-voltage cables to the electronic components or parts thereof.

DE 10 2014 002 522 A1 discloses a battery for a vehicle, comprising a plurality of interconnected battery cells and an arrester cooling system for cooling the battery cells, the arrester cooling system comprising a cooling plate, which is connected in a thermally conductive manner to the poles of the battery cells and which, in the region of the poles of the battery cells, has through openings, into or through which the poles protrude. The battery cells are each thermally contacted to the cooling plate via the associated poles by means of a thermally conductive and electrically insulating ceramic element.

SUMMARY

The object of the invention is to design a compact and robustly operable power converter device for a motor vehicle.

To attain this object, the invention provides that, in a motor vehicle of the type mentioned above, the cooling device has at least one coolant connection, which is fluidically connected to a coolant port of the electric motor to form a common cooling circuit.

The invention is based on the idea of incorporating the cooling device for cooling the power converter device into the cooling circuit of the electric motor, which serves, for example, for stator cooling and/or rotor cooling. This enables the cooling device to advantageously utilize existing cooling components of the electric motor, thereby reducing the amount of installation space required by the power converter device. At the same time, the number of fluid-conducting connection points that must be sealed can be reduced, and a more robust operation of the power converter device and of the motor vehicle as a whole can be achieved.

The power converter device is preferably located on a motor housing of the electric motor, with the power converter device and the motor housing delimiting a receiving area in which the coolant connection and the coolant port are located. The receiving area may be delimited by a frame-like and/or trough-like section of the motor housing. Said section is expediently provided on an outer side of the motor housing. It typically has walls that extend radially with respect to the axis of rotation of the electric motor. The power converter device can then be placed on the unattached ends of the walls, and can thereby cooperate with the walls of the motor housing to delimit the receiving area.

According to a particularly advantageous embodiment of the invention, the power converter device has a base plate for the positioning of components of the power converter device. Busbars that connect components to one another are also preferably routed along the base plate and can thus be cooled.

The cooling device may be formed by a plurality of cooling channels provided within the base plate. This enables the coolant to flow through the base plate. The base plate can therefore be used as an active heat sink to effectively dissipate heat generated by the components of the power converter device to the common cooling circuit.

In an alternative embodiment, the cooling device may be arranged on the base plate. In that case, the base plate is configured substantially as a support member for the components and the cooling device, and serves only passively for the transmission of heat to the cooling device arranged on it. Particularly preferably, the cooling device is recessed into the base plate. This means that the base plate has a recess, within which at least parts of the cooling device are held. This enables a particularly space-saving configuration of the cooling device.

For some embodiments of the motor vehicle according to the invention, it is expedient for the coolant connection to be located on the side of the base plate that faces the electric motor, or on at least one lateral edge of the base plate. Lateral edges in this context are the sides of the base plate that connect the side of the base plate that faces the electric motor to the side of the base plate that faces away from the electric motor.

As components of the power converter device, a power electronics converter unit, and/or an intermediate circuit capacitor, and/or a control device, and/or a DC voltage terminal for connecting the power converter device to a low-voltage electrical system of the motor vehicle may be provided. These components are preferably arranged on the side of the base plate that faces away from the electric motor.

The power converter unit is particularly preferably arranged on the cooling device, which is arranged on the base plate. Since the power converter unit typically makes the greatest contribution to the heat generated by the power converter device, direct thermal coupling with the cooling device is preferred. Even if the base plate itself forms the cooling device, it is advantageous to enable the greatest possible transfer of heat from the power converter unit to the base plate, for example via the largest possible contact surface. It is also advantageous for the intermediate circuit capacitor to be arranged directly on the base plate or the cooling device, since the intermediate circuit capacitor also contributes substantially to the heat generated by the power converter device.

Further components of the power converter device may include an electromagnetic filter unit, and/or an AC voltage terminal for electrically connecting the power converter device to the electric motor, and/or a DC voltage terminal for electrically connecting the power converter device to a high-voltage vehicle electrical system, and/or a DC voltage terminal for electrically connecting the electric motor to a low-voltage electrical system of the motor vehicle via the power converter device. These components are preferably arranged on the side of the base plate that faces the electric motor.

It is further preferable for a housing part of the power converter device to house the components arranged on the side that faces the electric motor. This housing part may also be referred to as the first housing part.

According to one embodiment variant, the coolant connection can extend through the housing part. In that case, the cooling device lies partially within the housing part and extends outside of the housing part such that at least the coolant connection lies outside of the housing part.

An alternative embodiment variant provides that the coolant connection is located outside of the housing part on the base plate. In that case, the housing part houses only a section of the base plate, so that at least one section of the base plate lies outside of the housing part. This enables the coolant connection to be accessed particularly easily from the outside. Particularly preferably, the coolant connection provided outside of the housing part is located on the side of the base plate that faces the electric motor, or on the or one lateral edge of the base plate.

It is further expedient for a housing part of the power converter device to house the components arranged on the side that faces away from the electric motor. Said housing part may also be referred to as the second housing part. Preferably, said housing part completely houses the side of the base plate that faces away from the electric motor. Said housing part may be fastened or fastenable by means of fastening elements onto the motor housing, in particular onto the frame-like and/or trough-like section and/or onto the walls of the motor housing.

The housing parts are preferably configured as separate or are parts of one integral housing.

The object of the invention is further attained by a power converter device for the motor vehicle according to the invention. All embodiments of the motor vehicle according to the invention can be analogously transferred to the power converter device according to the invention, and therefore, the aforementioned advantages can also be achieved therewith.

BRIEF DESCRIPTION OF THE DRAWINGS

Further advantages and details of the invention will be apparent from the exemplary embodiments described in the following, and in reference to the drawings. These are schematic representations and show.

DETAILED DESCRIPTION

Figure 1:
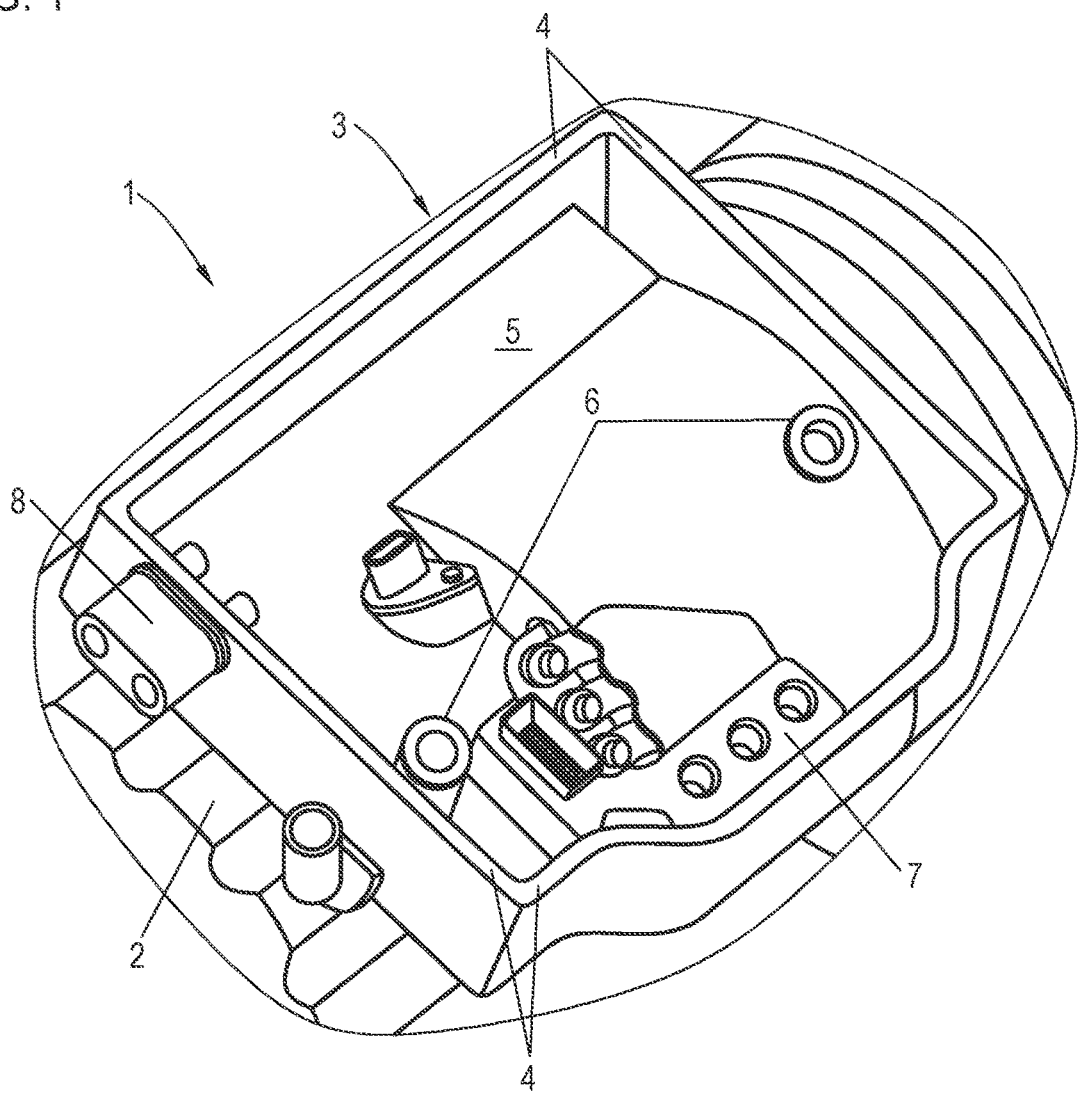
FIG. 1 a detailed diagram of an electric motor for a motor vehicle.

FIG. 1 shows a detailed view of an electric motor 1, in which a section of a motor housing 2 is visible.

The motor housing 2 has a frame-like or trough-like section 3 with a plurality of walls 4, which delimit a receiving area 5. Within the receiving area 5, a coolant port 6 is provided for introducing and removing a coolant for cooling a stator and/or a rotor of the electric motor 1. Also provided within the receiving area 5 is a connector device 7 for supplying the electric motor 1 with a three-phase AC voltage and with a DC voltage of, for example, 12 volts, supplied by a low-voltage battery. Further, integrated into one wall 4 is a DC voltage terminal 8 for supplying a DC voltage from a high-voltage battery, to be converted into the AC voltage.

In an assembled state, the side of the receiving area 5 that is open in FIG. 1 is additionally delimited by a power converter device 9 (cf., FIGS. 2 to 5), which is placed on the motor housing 2 and fastened to the walls 4. The power converter device 9 converts the DC voltage supplied via the DC voltage terminal 8 to the three-phase AC voltage, and enables the low-voltage battery to be connected to the connector device 7. The power converter device 9 further has a cooling device 10 with coolant connections 11 (cf., FIG. 2 to 5), which are or can be connected to the coolant port 6 in order to form a common cooling circuit for the electric motor 1 and the power converter device 9.

Figure 2:
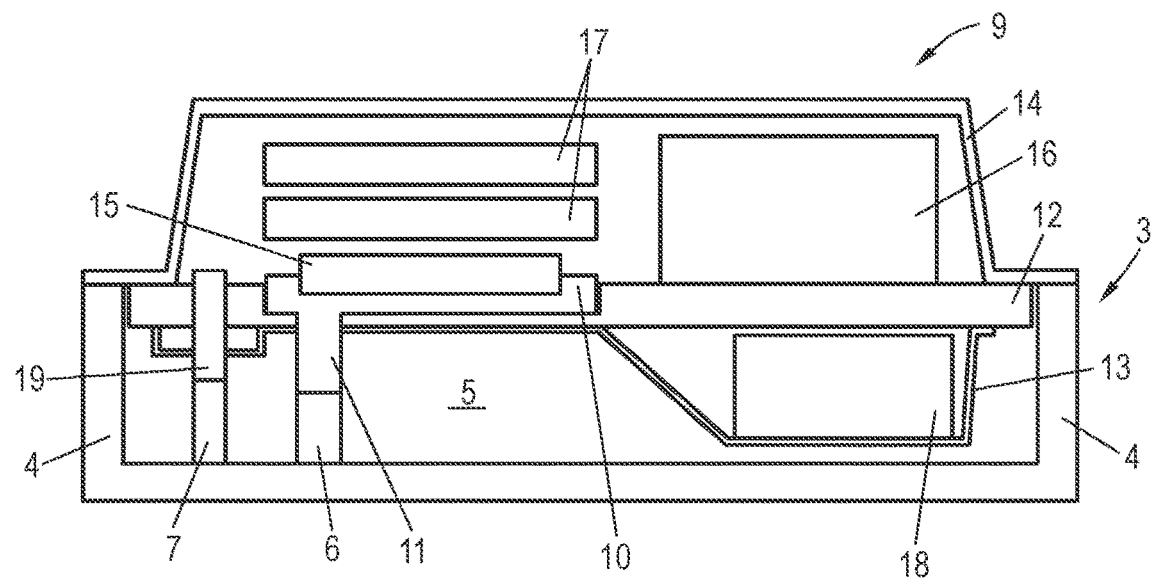
FIG. 2 a cross-sectional view of a first exemplary embodiment of a power converter device for the motor vehicle according to the invention.

FIG. 2 shows a cross-sectional diagram of a first exemplary embodiment of a power converter device 9, including the receiving area 5 and the section 3 having the walls 4 of the motor housing 2.

The power converter device 9 comprises a base plate 12 into which the cooling device 10 is integrated, a first housing part 13 on the side of the base plate 12 that faces the electric motor 1, and a second housing part 14 on the side of the base plate 12 that faces away from the electric motor 1. The cooling device 10 penetrates the base plate 13 and the first housing part 13 in such a way that the coolant connections 11 (only one visible in FIG. 2) extend into the receiving area 5, where they can be connected to the coolant port 6.

A plurality of components of the power converter device 9 are arranged on the side of the base plate 12 that faces away from the electric motor 1, and are housed by the second housing part 14, which is preferably made of a metal, such as aluminum. The components are a power electronics converter unit 15, an intermediate circuit capacitor 16, control units of a control device 17 for controlling the power converter unit 15, and a DC voltage terminal (not shown) for connecting the power converter device to the low-voltage battery. Here, the power converter unit 15 is located directly on the cooling device 10 through which coolant flows, because the power converter unit makes the greatest contribution to the heat generated during operation of the power converter device 9. The intermediate circuit capacitor 16 is coupled in a thermally conductive manner to the base plate 12, in order to conduct the heat generated by the intermediate circuit capacitor during operation via the base plate to the cooling device 10.

Additional components of the power converter device 9 are arranged on the side of the base plate 12 that faces the electric motor 1, and are housed by the first housing part 13, which is preferably made of a plastic, such as polyamide. The components are an electromagnetic filter unit 18, an AC voltage terminal 19 for electrically connecting the power converter device 9 to the connector device 7, a DC voltage terminal (not shown) for electrically connecting the power converter device 9 to a high-voltage battery via the DC voltage terminal 8, and a DC voltage terminal (not shown) for electrically connecting the electric motor 1 to the low-voltage battery via the connector device 7.

While the first housing part 13 rests on the base plate 12 and is fastened thereto, the second housing part 14 overlaps the base plate 12 and, in the mounted state, rests on section 3 of the motor housing 2. The receiving area 5 is thereby closed off. The second housing part 14 is attached to the walls 4 by fastening means (not shown). As an alternative to the multi-part embodiment of the housing parts 13, 14 shown, it is also conceivable for the housing parts 13, 14 to form one integral housing.

Figure 3:
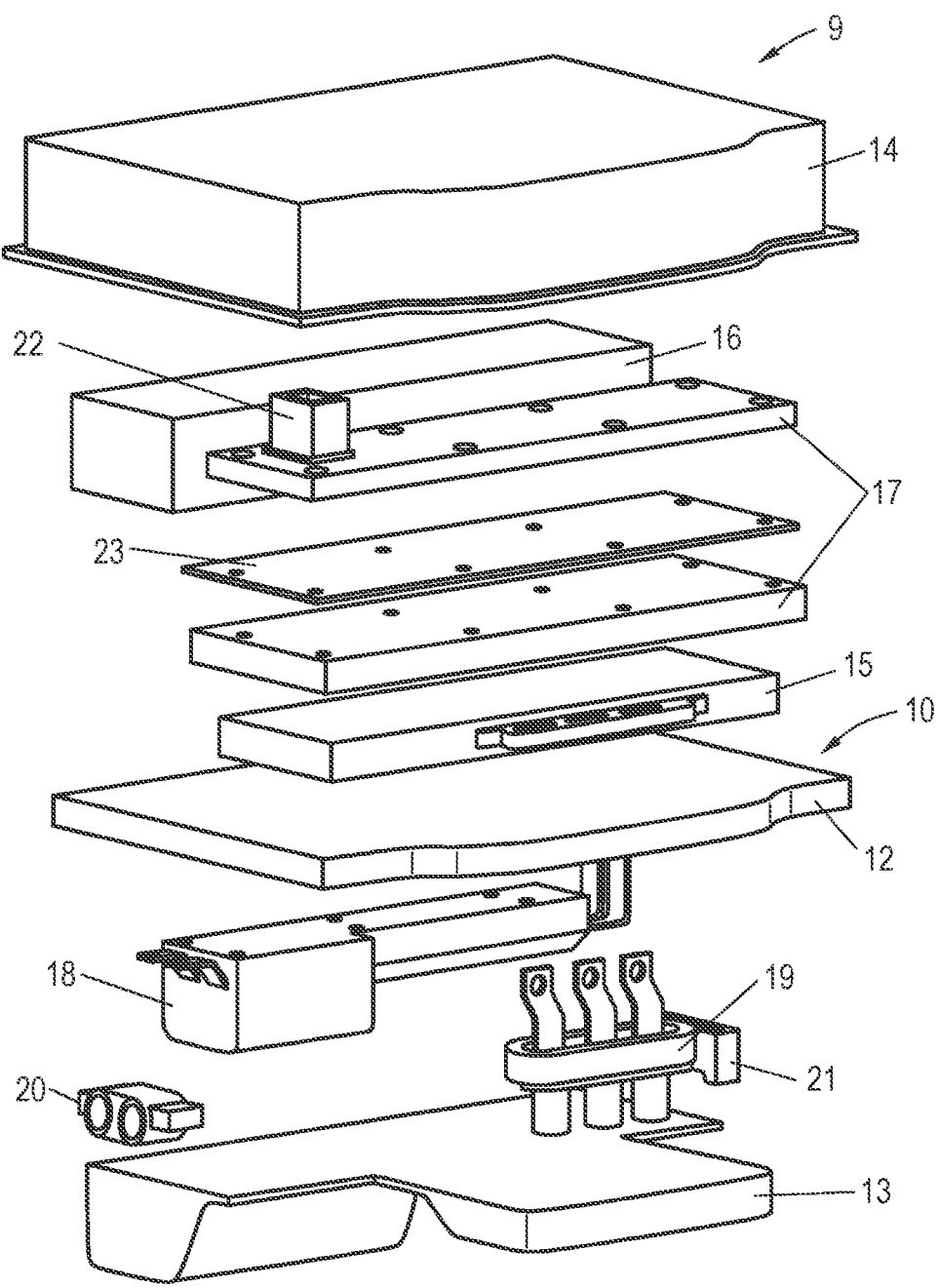
FIG. 3 an exploded view of another exemplary embodiment of a power converter device for the motor vehicle according to the invention.

FIG. 3 shows an exploded view of another exemplary embodiment of a power converter device 9; elements that are the same as or equivalent to elements in FIG. 2 have been denoted by identical reference signs. The power converter device 9 differs from the one shown in FIG. 2 essentially in that the base plate 12 is configured as a cooling device 10 through which coolant flows, and for this purpose, cooling channels 11b are provided inside the base plate 12. Furthermore, the coolant connections 11 (cf., FIG. 4) do not extend through the base plate 12 and the first housing part 13, and are instead formed outside of the housing parts 13, 14, on the side of the base plate 12 that faces the electric motor 1.

Also shown in FIG. 3 are the DC voltage terminal 20 for electrically connecting the power converter device 9 to a high-voltage battery via the DC voltage terminal 8, the DC voltage terminal 21 for electrically connecting the electric motor 1 to the low-voltage battery via the connector device 7, the DC voltage terminal 22 for connecting the power converter device 9 to the low-voltage battery, and a shielding means 23 for the control device 17 between its control units.

Figure 4:
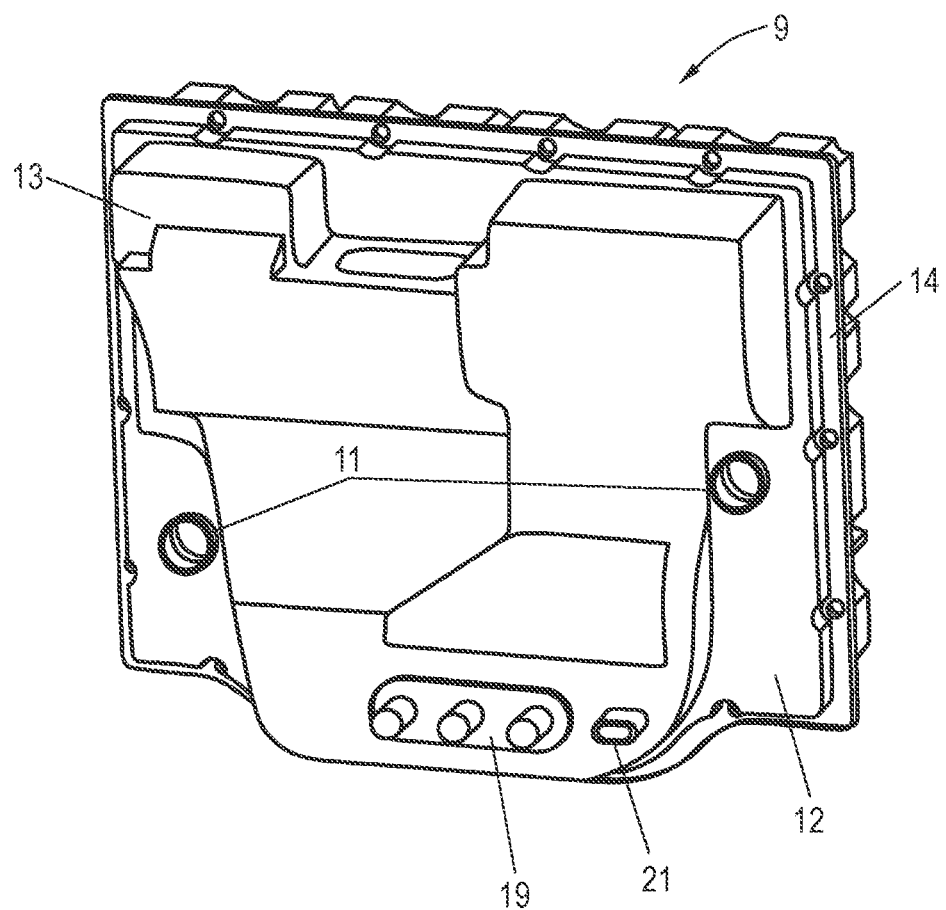
FIG. 4 a perspective view of the power converter device shown in FIG. 3.

FIG. 4 shows a perspective view of the power converter device 9 shown in FIG. 3, from the side of the base plate 12 that faces the electric motor 1. The coolant connections 11 of the cooling device 10, configured as openings in the base plate 12 into which the cooling channels lead, are clearly visible. The coolant connections can thus be connected, via suitable connection means, to the coolant port 6 of the electric motor 1.

Figure 5:
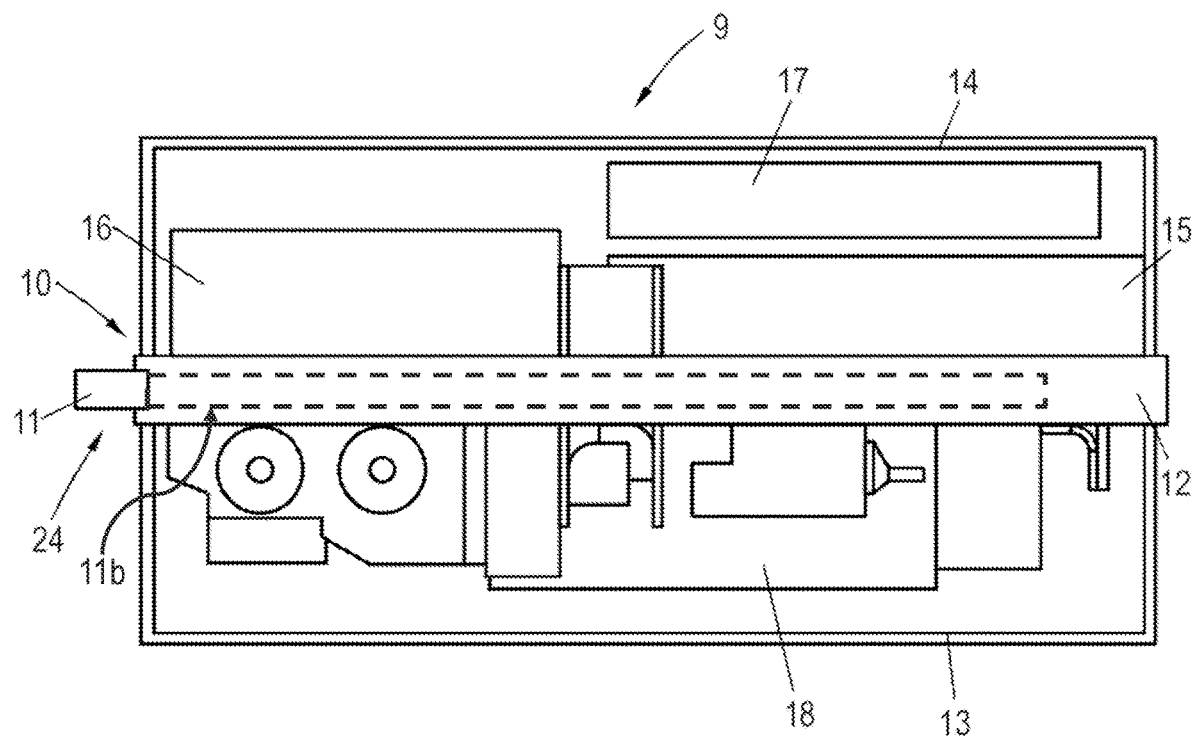
FIG. 5 a cross-sectional schematic diagram of another exemplary embodiment of a power converter device for the motor vehicle according to the invention.

FIG. 5 shows a cross-sectional schematic diagram of another exemplary embodiment of a power converter device 9; elements that are the same as or equivalent to elements in FIG. 3 have been denoted by identical reference signs. The power converter device 9 differs from the one shown in FIG. 3 essentially in that the coolant connections 11 are located on a lateral edge 24 of the base plate.

Figure 6:
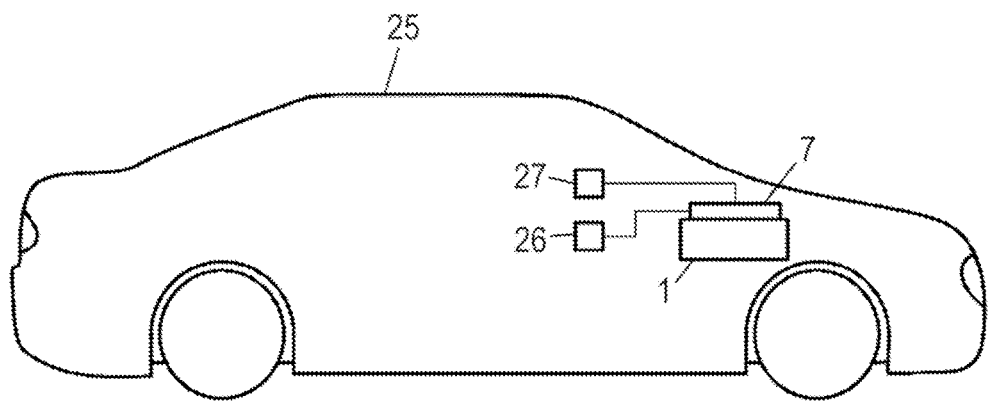
FIG. 6 a schematic diagram of an exemplary embodiment of a motor vehicle according to the invention.

FIG. 6 shows a schematic diagram of a motor vehicle 25 comprising an electric motor 1 according to FIG. 1 for the partially or fully electric driving of the motor vehicle 25, and a power converter device 9 attached thereto according to any of the aforementioned exemplary embodiments. The power converter device 9 is connected via DC voltage terminal 8 to a high-voltage vehicle electrical system 26, and is connected via DC voltage terminal 23 to a low-voltage electrical system 27 of the motor vehicle 25.

The invention claimed is:

1. A motor vehicle comprising an electric motor for driving the motor vehicle and a power converter device for supplying an alternating current o the electric motor,
   wherein the power converter device comprises a cooling device which has at least one coolant connection and which is fluidically connected to a coolant port of the electric motor to form a common cooling circuit,
   wherein a housing of the electric motor is formed having a plurality of walls which extend substantially radially from the housing and which delimit a receiving area,
   wherein the coolant port is arranged in the receiving area,
   wherein the power converter device comprises a base plate upon which components of the power converter device are arranged, and the base plate rests in the receiving area unattached to the plurality of walls,
   wherein the cooling device is arranged on or integral with the base plate,
   wherein those of the components provided on a first side of the base plate facing the housing are housed by a first housing part formed from plastic,
   wherein those of the components provided on a second side of the base plate facing away from the housing are housed by a second housing part, and
   wherein the second housing part is fastened to the plurality of walls.

2. The motor vehicle according to claim 1, wherein the cooling device comprises a plurality of cooling channels.

3. The motor vehicle according to claim 2, wherein a power converting unit of the power converter device is arranged on the cooling device.

4. The motor vehicle according to claim 1, wherein the cooling device is recessed into the base plate.

5. The motor vehicle according to claim 1, wherein the components of the power converter device comprise at least one of a power electronics converter unit, an intermediate circuit capacitor, a control device, and a DC voltage terminal.

6. The motor vehicle according to claim 1, wherein the components of the power converter device comprise at least one of an electromagnetic filter unit, an AC voltage terminal for electrically connecting the power converter device to the electric motor, and a DC voltage terminal.

7. The motor vehicle according to claim 1, wherein the coolant connection extends through the first housing part.

8. The motor vehicle according to claim 1, wherein a connector for supplying the electric motor with three-phase AC voltage is provided in the receiving area.

9. The motor vehicle according to claim 1, wherein one of the plurality of walls is provided with a DC voltage terminal extending therethrough for supplying current to be converted by the power converter device.

* * * * *